US009591779B2

(12) United States Patent
Obana

(10) Patent No.: US 9,591,779 B2
(45) Date of Patent: Mar. 7, 2017

(54) ELECTRONIC APPARATUS CAPABLE OF ACCOMMODATING THEREIN MEMBER INCLUDING CABLE

(71) Applicant: CANON KABUSHIKI KAISHA, Tokyo (JP)

(72) Inventor: Shinji Obana, Kunitachi (JP)

(73) Assignee: Canon Kabushiki Kaisha, Tokyo (JP)

( * ) Notice: Subject to any disclaimer, the term of this patent is extended or adjusted under 35 U.S.C. 154(b) by 565 days.

(21) Appl. No.: 13/713,721

(22) Filed: Dec. 13, 2012

(65) Prior Publication Data
US 2013/0163221 A1 Jun. 27, 2013

(30) Foreign Application Priority Data
Dec. 21, 2011 (JP) .................................. 2011-280025

(51) Int. Cl.
*H05K 5/00* (2006.01)
*H05K 5/02* (2006.01)
(Continued)

(52) U.S. Cl.
CPC ........ *H05K 5/0247* (2013.01); *H01M 6/5027* (2013.01); *H01M 2/1066* (2013.01)

(58) Field of Classification Search
CPC .. H05K 5/0247; H05K 5/0086; H05K 5/0017; H01M 2/1066
See application file for complete search history.

(56) References Cited

U.S. PATENT DOCUMENTS

| 4,167,301 A * | 9/1979 | Mundschenk ....... H05K 5/0247 439/457 |
| 4,988,831 A * | 1/1991 | Wilson ................. H05K 5/0247 174/135 |

(Continued)

FOREIGN PATENT DOCUMENTS

| JP | 02-18210 U | 2/1990 |
| JP | 2005-064365 | 3/2005 |

(Continued)

OTHER PUBLICATIONS

The above foreign patent documents in the Nov. 17, 2015 Japanese Office Action, which is enclosed without an English Translation, that issued in Japanese Patent Application No. 2011-280025.

*Primary Examiner* — Zachary M Pape
*Assistant Examiner* — Douglas Burtner
(74) *Attorney, Agent, or Firm* — Cowan, Liebowitz & Latman, P.C.

(57) ABSTRACT

An electronic apparatus that prevents a cable included in a coupler accommodated in an accommodating part from being caught between a battery lid and an apparatus body, with a simple construction. The electronic apparatus includes an accommodating part for accommodating a coupler, a battery lid which opens and closes an opening of the accommodating part, and a lock member including a pawl portion which restricts the coupler from being discharged from the accommodating part when the coupler has been accommodated therein. A portion defining the opening of the battery accommodating part is formed with a cutout for routing out the cable. When the coupler is accommodated and the cable has been arranged in the cutout, the pawl portion covers at least part of the cable.

3 Claims, 5 Drawing Sheets

(51) Int. Cl.
*H01M 6/50* (2006.01)
*H01M 2/10* (2006.01)

(56) References Cited

U.S. PATENT DOCUMENTS

| | | | | |
|---|---|---|---|---|
| 5,221,813 | A * | 6/1993 | Michael | H05K 5/0247 |
| | | | | 174/135 |
| 5,568,365 | A * | 10/1996 | Hahn | H05K 5/0247 |
| | | | | 361/752 |
| 7,688,596 | B1 * | 3/2010 | Gardner | H01G 9/016 |
| | | | | 174/520 |
| 2001/0015392 | A1 * | 8/2001 | Ito | H05K 5/0247 |
| | | | | 242/388.2 |
| 2002/0057360 | A1 * | 5/2002 | Abe | H04N 5/2252 |
| | | | | 348/373 |
| 2005/0057879 | A1 * | 3/2005 | Fan | H01R 25/003 |
| | | | | 361/118 |
| 2006/0256524 | A1 * | 11/2006 | Chen | H05K 5/0247 |
| | | | | 361/695 |
| 2011/0008980 | A1 * | 1/2011 | Obata | G11B 33/025 |
| | | | | 439/131 |
| 2011/0019964 | A1 * | 1/2011 | Nhep | G02B 6/3825 |
| | | | | 385/135 |
| 2012/0097425 | A1 * | 4/2012 | Sakai | H05K 5/0247 |
| | | | | 174/135 |
| 2012/0170176 | A1 * | 7/2012 | Knight | H01R 13/72 |
| | | | | 361/679.01 |

FOREIGN PATENT DOCUMENTS

| | | | |
|---|---|---|---|
| JP | EP 1740032 A2 * | 1/2007 | ......... H01R 13/5812 |
| JP | 2008-118393 A | 5/2008 | |
| JP | 2009-086130 A1 | 4/2009 | |

* cited by examiner

ELECTRONIC APPARATUS CAPABLE OF ACCOMMODATING THEREIN MEMBER INCLUDING CABLE

BACKGROUND OF THE INVENTION

Field of the Invention

The present invention relates to an electronic apparatus, more particularly to an electronic apparatus capable of accommodating therein a member including a cable.

Description of the Related Art

As an electronic apparatus, such as a digital camera, there has been known one that has a battery accommodating part provided in an apparatus main unit thereof for accommodating a battery, and connection terminals disposed at a bottom surface of the battery accommodating part, for connection to the battery, and brings electrodes of the battery accommodated in the battery accommodating part into contact with the connection terminals to thereby supply power from the battery to the apparatus main unit. Further, there has been known one configured to accommodate a coupler in the battery accommodating part in place of a battery, and supply electric power to the apparatus main unit by connecting the coupler to an external power source to thereby operate the apparatus main unit.

There has been proposed a structure related to the electronic apparatus including the above-mentioned battery accommodating part, in which when a coupler including a power cable is mounted in the battery accommodating part, the cable is extended out of the apparatus main unit through an extending outlet for routing the cable out of the electronic apparatus (see Japanese Patent Laid-Open Publication No. 2005-64365). In the technique described in Japanese Patent Laid-Open Publication No. 2005-64365, a lid member formed of an elastic member is disposed at the outlet for extending the power cable to thereby prevent e.g. dust from entering the battery accommodating part. Further, this publication proposes a structure that prevents the lid member from being pressed into the opening by an external force applied e.g. when the lid member is pressed by a finger of the user.

However, in the technique described in the above-mentioned publication, after the coupler including the power cable has been accommodated in the battery accommodating part, the power cable is liable to bend back toward the opening side of the battery accommodating part by a reaction force of the lid member formed of the elastic material. Therefore, even when the user tries to close a battery lid for opening and closing the opening of the battery accommodating part, the power cable is liable to be caught between the battery lid and the apparatus main unit due to the bending of the power cable, which sometimes makes it difficult to close the battery lid.

SUMMARY OF THE INVENTION

The present invention provides an electronic apparatus that prevents, when a member including a cable is accommodated in an accommodating part provided in the electronic apparatus and then the opening of the accommodating part is closed by a lid member, the cable from being caught between the battery lid and the apparatus body, with a simple construction.

In a first aspect of the present invention, there is provided an electronic apparatus comprising a main unit including an accommodating part for accommodating a coupler member including a cable, a lid member configured to open and close an opening of the accommodating part, and a lock member including a pawl portion which restricts the coupler member from being discharged from the accommodating part in a state where the coupler member has been accommodated in the accommodating part, wherein in the main unit, a portion defining the opening of the accommodating part has a cutout formed therein for routing out the cable of the coupler member when the coupler member has been accommodated in the accommodating part, and wherein in a state where the cable has been arranged in the cutout and the coupler member has been accommodated in the accommodating part, the pawl portion covers at least part of the cable.

In a second aspect of the present invention, there is provided an electronic apparatus including a coupler member including a cable, and a main unit in which the coupler is accommodated, wherein the main unit comprises an accommodating part configured to accommodate the coupler member, a lid member configured to open and close an opening of the accommodating part, a lock member configured to restrict the coupler member from being discharged from the accommodating part in a state where the coupler member has been accommodated in the accommodating part, the lock member including a pawl portion which covers at least part of the cable, and a cutout formed in a portion defining the opening of the accommodating part so as to route out the cable of the coupler member when the coupler member has been accommodated in the accommodating part, wherein the coupler member comprises a body from which the cable is extended, and a slit defining portion which is integrally formed with the body, and defines a slit for routing the cable out of the body, the slit defining portion including protrusions formed on inner walls thereof for latching the cable in the slit, and wherein in the state where the coupler member has been accommodated in the accommodating part and the cable has been arranged in the cutout, a length of the pawl portion which covers the cable is longer than a length of each protrusion protruding from the inner wall.

According to the present invention, when the member having the cable is accommodated in the accommodating part provided in the electronic apparatus and then the opening of the accommodating part is closed by the lid member, it is possible to prevent the cable from being caught between the battery lid and the apparatus body, with a simple construction.

Further features of the present invention will become apparent from the following description of exemplary embodiments with reference to the attached drawings.

DESCRIPTION OF THE EMBODIMENTS

The present invention will now be described in detail below with reference to the accompanying drawings showing embodiments thereof. In the present embodiment, a digital camera as an example of an image pickup apparatus will be described as an electronic apparatus according to the present invention, but the present invention is not limited to this.

Figure 1A:
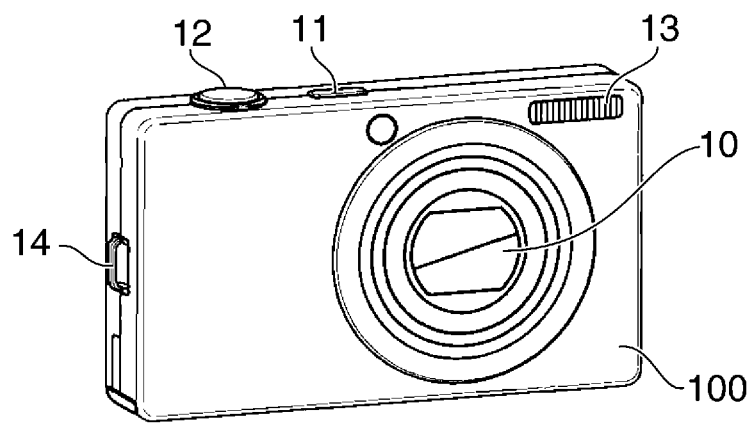
FIG. 1A is a perspective view of the appearance of a digital camera according to an embodiment of the present invention, as taken obliquely from the front.
Figure 1B:
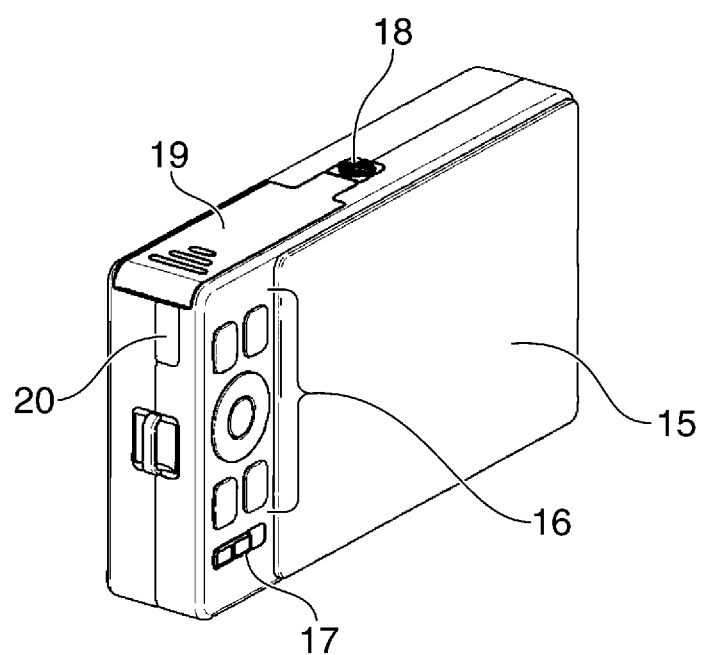
FIG. 1B is a perspective view of the appearance of the digital camera shown in FIG. 1A, as taken obliquely from the rear.

FIGS. 1A and 1B are perspective views of the digital camera according to the embodiment of the present invention, in which FIG. 1A is the perspective view of the appearance of the digital camera, as taken obliquely from the front, and FIG. 1B is the perspective view of the appearance of the digital camera, as taken obliquely from the rear.

On the front surface of a camera body 100 as the main unit of the digital camera, there are arranged an image pickup unit 10 including a collapsible lens barrel and a light emitter 13, and on the upper surface of the camera body 100, there are arranged a power button 11 and a release button 12. When a user presses the power button 11 in a state in which the power can be supplied to the camera body 100, the lens barrel forming the image pickup unit is extended, which makes it possible to perform shooting. Then, when the user presses the power button 11 again e.g. after termination of shooting, the lens barrel is retracted into the camera body 100 and accommodated therein.

When the user presses the release button 12 in the shooting state (power-on state) in which the lens barrel has been extended, shooting is performed after focusing on an object. The light emitter 13 flashes when a controller (not shown) determines that the light amount of reflected light is insufficient, according to the shooting environment or when the user selects flashing of the light emitter 13 according to his/her own will, which makes it possible to obtain a high-quality image.

A lateral side of the camera body 100 is provided with a strap attaching part 14 to which a strap accessory used for carrying the camera body 100 is attached.

A rear surface of the camera body 100 is provided with a display section 15, and the display section 15 displays an image or a video obtained during shooting, images and videos which have been shot and stored in a storage medium (not shown), and various kinds of information for setting or changing the operating conditions of the camera body 100. The user can set intended shooting conditions and operating conditions of the camera body 100 via the display section 15 by operating operation buttons 16 and a mode switching button 17, which are arranged at respective locations adjacent to the display section 15.

A bottom surface of the camera body 100 is provided with a tripod mounting part 18 for mounting a tripod so as to perform shooting in which camera shake is reduced or shooting using a self-timer. Further, on the bottom surface of the camera body 100, there are arranged a battery accommodating part (neither shown in FIG. 1A or 1B) as a part for accommodating a battery which supplies power to the camera body 100 and mounting the battery in the camera body 100, and a battery lid 19 as a lid which opens and closes an opening of the battery accommodating part. The user opens the battery lid 19 to insert or remove the battery.

Note that in the present embodiment, in an opened state of the battery lid 19, it is also possible to insert or remove an external storage medium that stores shot images. As the external storage medium, it is possible to employ e.g. a memory card containing a flash memory. The lateral side of the camera body 100 is provided with a cable lid 20 in the vicinity of the battery lid 19. The cable lid 20 will be described hereinafter.

Figure 2A:
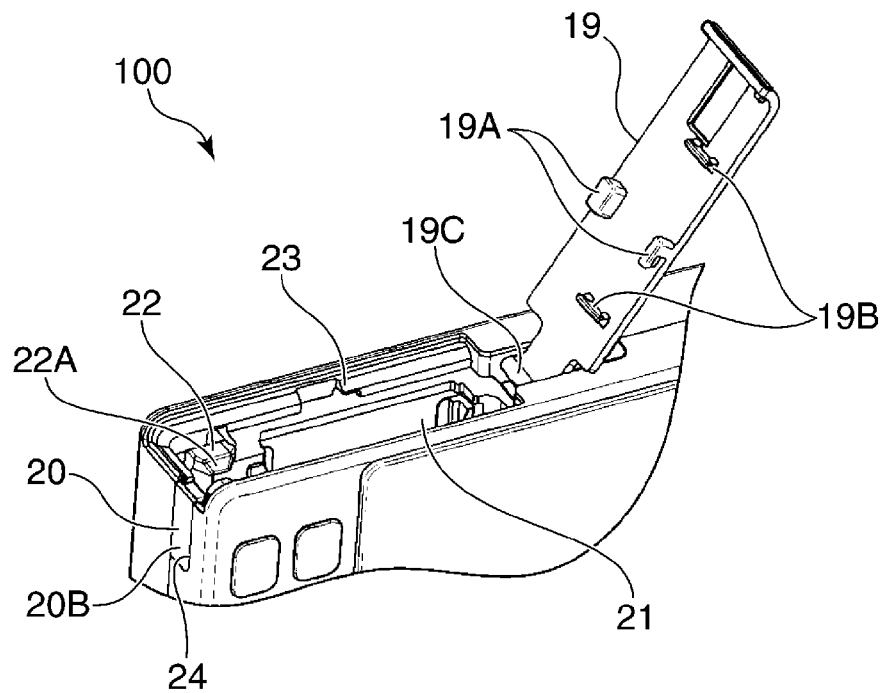
FIG. 2A is a perspective view of an opening and its surrounding portions taken when a battery lid appearing in FIG. 1B is opened.
Figure 2B:
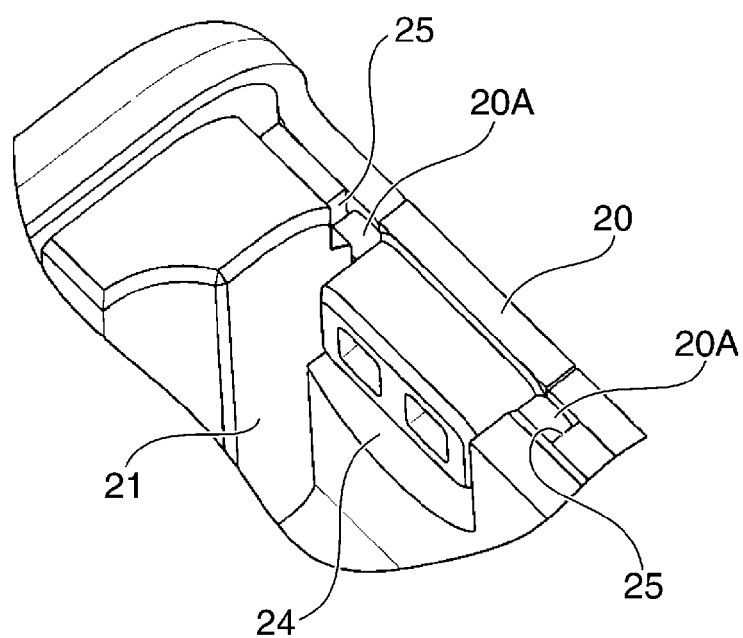
FIG. 2B is a partial view showing details of a cable lid and its surrounding portions, as part of the opening appearing in FIG. 2A.

FIGS. 2A and 2B are perspective views each showing a state where the battery lid 19 appearing in FIG. 1B is opened, in which FIG. 2A shows the opening of the battery accommodating part and its surrounding portions in the state where the battery lid 19 is opened, and FIG. 2B shows the cable lid 20 and its surrounding portions in detail. The battery lid 19 protects a battery or a coupler (coupler member), described hereinafter, accommodated in the battery accommodating part, denoted by reference numeral 21 in FIGS. 2A and 2B, from the outside. When the battery lid 19 is opened, the battery accommodating part 21 for accommodating the battery is exposed to the outside. To mount the battery in the battery accommodating part 21, the user opens the battery lid 19 as shown in FIG. 2A, and inserts the battery in the battery accommodating part 21.

As shown in FIG. 2A, a lock member 22 is arranged at an end of the battery accommodating part 21 in a manner illustrated therein, and is held in the camera body 100 in a manner pivotal about a pivotal shaft (not shown). Further, the lock member 22 has a pawl portion 22A formed at an end thereof, which is urged by a predetermined urging means (not shown) in a direction of closing the battery accommodating part 21. Therefore, to insert the battery in the battery accommodating part 21, it is necessary to pivot the lock member 22 in a direction against the urging force of the urging unit to thereby prevent the pawl portion 22A of the lock member 22 from blocking the opening of the battery accommodating part 21. The predetermined urging means may be the resilience of the lock member 22 or may be a member additionally provided therefor.

When the lock member 22 is released after the battery has been accommodated in the battery accommodating part 21, the lock member 22 is pivoted by action of the urging force of the urging unit, and the pawl portion 22A blocks the opening of the battery accommodating part 21, and the pawl portion 22A of the lock member 22 is engaged with the bottom surface of the battery. This makes it possible to prevent the battery from falling off.

To close the battery lid 19, the battery lid 19 is pivoted about a pivotal shaft 19C in a direction of closing the battery accommodating part 21, and is further slid toward the tripod mounting part 18 in a state where the battery lid 19 is placed over the battery accommodating part 21 in a manner blocking the opening of the battery accommodating part 21. As a result, a plurality of engaging parts 19A formed on the battery lid 19 are engaged with a plurality of engaged parts 23 formed around the battery accommodating part 21, whereby the battery lid 19 is fixed to the camera body 100.

In this state, a certain amount of space is provided between the battery and the battery lid accommodating part 21, so as to make it possible to smoothly insert or remove the battery. Therefore, an end of the battery with which the lock member 22 is not engaged (end of the battery toward the pivotal shaft 19C) swings on an end of the battery engaged with the lock member 22 within this space. If the battery remains in this state, when an unintended external force is applied to the camera body 100 during the operation of the camera body 100, the electrical contact between the battery and the camera body 100 becomes unstable, which may cause a problem that the power supply to the camera body 100 is temporarily interrupted.

To prevent this problem from occurring, in the digital camera according to the present embodiment, as shown in FIG. 2A, protrusions 19B are provided at two locations on the battery lid 19, and when the battery lid 19 is closed, the protrusions 13B are brought into close contact with the exposed surface of the battery, whereby the movement of the battery is restricted. This prevents the battery from being shaken within the battery accommodating part 21, whereby it is possible to prevent occurrence of such a problem as the above-mentioned temporary interruption of the power supply.

To remove the battery accommodated in the battery accommodating part 21, the battery lid 19 is slid in a direction away from the tripod mounting part 18, and then is pivoted about the pivotal shaft 19C, whereafter the battery lid 19 is opened. The bottom surface of the battery accommodating part 21 is provided with a discharge spring (not shown) which urges the battery in a direction of discharging the battery out of the battery accommodating part 21. Therefore, when the battery is released from the state latched by the pawl portion 22A of the lock member 22, the battery is pushed out of the battery accommodating part 21 by the urging force of the discharge spring, whereby it is possible to remove the battery.

As shown in FIG. 2B, a portion of the lateral side of the camera body 100 defining the opening of the battery accommodating part 21 is formed with a cutout 24, and the cable lid 20 having an outline shape which is complementary to the shape of the cutout 24 is disposed in a manner blocking the cutout 24. The cable lid 20 is formed of an elastic material, such as rubber, which is more elastically-deformable than at least the plastic battery lid 19.

An upper portion of the cable lid 20 is integrally formed with a pair of come-off preventing portions 20A extending toward opposite sides of the cutout 24 in respective directions along the width of the cutout 24. The come-off preventing portions 20A are inserted into a pair of grooves 25 formed in the camera body 100, respectively. The width of the cable lid 20 including the come-off preventing portions 20A is configured to be slightly longer than that of the cutout 24, and the cable lid 20 is elastically deformed to have the come-off preventing portions 20A fitted in the grooves 25, whereby the cable lid 20 is latched in the cutout 24.

Further, the cable lid 20 is elastically deformably fixed by a fixing method, not illustrated, to the camera body 100 via a holding portion 20B on a side opposite from the come-off preventing portions 20A. As described above, the cable lid 20 is formed of the elastic material, such as rubber, which is elastically deformable. Therefore, by pushing outward a portion of the cable lid 20 toward the come-off preventing portions 20A latched in the grooves 25, the cable lid 20 is elastically deformed in a manner pivoting (bending) about the holding portion 20B, whereby the cutout 24 can be made open.

Figure 3A:
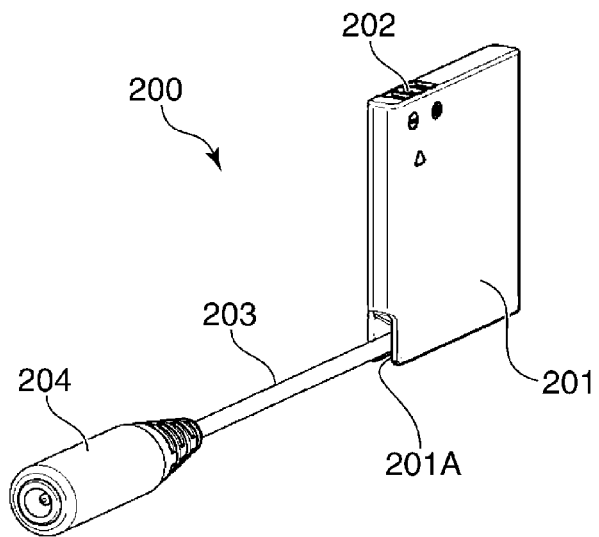
FIG. 3A is an overall perspective view of a coupler.
Figure 3B:
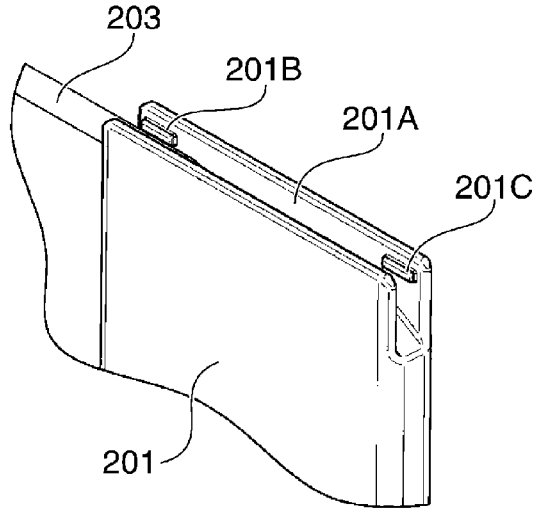
FIG. 3B is an enlarged perspective view of part of the coupler where the cable included in the coupler extends out of a body of the coupler.
Figure 3C:
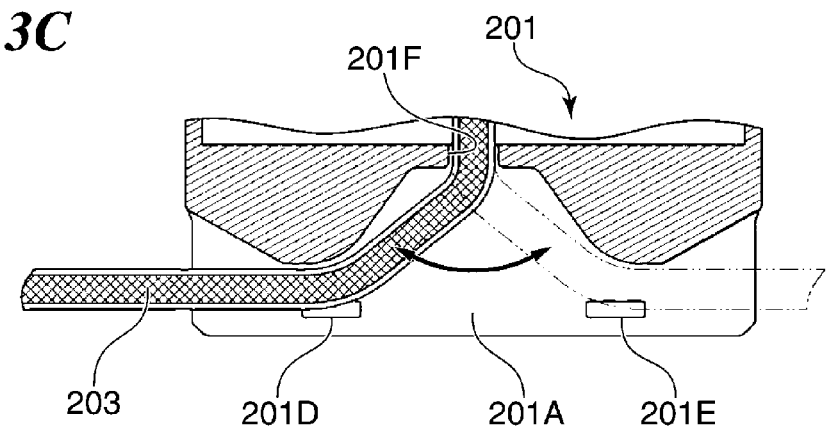
FIG. 3C is a cross-sectional view of part of the coupler where the cable extends out of the body of the coupler.

In the present embodiment, as an example of a member that has a structure to which a cable is connected and can be accommodated in the battery accommodating part 21, a coupler used for supplying electric power from an external power source to the digital camera will be described. FIGS. 3A to 3C are views each showing the structure of the coupler, in which FIG. 3A is an overall perspective view of the coupler, FIG. 3B is an enlarged perspective view of part of the coupler where the cable included in the coupler extends out of a body of the coupler, and FIG. 3C is a cross-sectional view of part of the coupler from which the cable extends out.

As shown in FIG. 3A, the coupler, denoted by reference numeral 200, has the structure in which the cable, denoted by reference numeral 203, extends out of a coupler body 201, i.e. the body of the coupler 200, and the other end of the cable 203 is provided with a connection part 204. The coupler body 201 has substantially the same outer dimensions as those of the battery for being accommodated in the battery accommodating part 21. The coupler body 201 is formed with electrodes 202, and when the coupler body 201 is mounted in the battery accommodating part 21 of the camera body 100, the electrodes 202 are connected to a connector of the camera body 100. This electrically connects the coupler 200 to a power control circuit including a DC/DC converter (not shown) provided in the camera body 100. Therefore, for example, when the connection part 204 of the coupler 200 is connected to an AC/DC converter connected to an AC power supply, an AC voltage from the AC power supply is converted to a desired DC voltage by the AC/DC converter, and is supplied to the camera body 100 via the coupler 200.

As shown in FIGS. 3B and 3C, the coupler body 201 is formed with a slit 201A for routing out the cable 203 wired from a circuit board (not shown) arranged therein through a hole 201F. One of inner walls of the slit 201A is formed with protrusions 201B and 201C, and the other of the inner walls is formed with protrusions 201D and 201E opposed to the protrusions 201B and 201C, respectively. These protrusions 201B to 201E latch the cable 203 such that the cable 203 is received within the slit 201A.

Note that, as indicated by two-dot chain lines in FIG. 3C, the coupler 200 has a structure which enables the direction of routing out the cable 203 to be switched in a manner turning through 180 degrees about the hole 201F from which the cable 203 is routed out of the couple body 201. This makes it possible to properly set the direction of routing out the cable 203 e.g. when the coupler 200 is mounted to an electronic apparatus having a different structure from that of the digital camera according to the present embodiment. Further, this increases the degree of freedom of the layout of a connector to be electrically connected to the coupler body 201 within the electronic apparatus, and thereby makes it possible to realize downsizing of the electronic apparatus by more dense concentrated arrangement of various component structures forming the electronic apparatus.

To change the direction of routing out the cable 203 from the direction indicated by solid lines in FIG. 3C to the direction indicated by the two-dot chain lines, first, the cable 203 is routed such that the direction of extending the cable 203 is inverted. At this time, the protrusions 201B and 201D are brought into contact with the extending portion of the cable 203 (portion extending from the hole 201F) in the slit 201A. However, a jacket enclosing the conductor of the cable 203 is formed of a material having a certain elasticity. Therefore, the user can release the cable 203 from the latching by the protrusions 201B and 201D by pulling the cable 203 with a certain amount of force to pull the extending portion of the cable 203 out of the slit 201A.

When the cable 203 is further inverted, although the extending portion of the cable 203 is brought into contact with the protrusions 201C and 201E, by making use of the elasticity of the jacket of the cable 203, the cable 203 is pushed into a position where the cable is latched by the protrusions 201C and 201E, with a certain amount of force. Thus, the changing of the direction of routing out the cable 203 is completed.

Note that it is desirable to form the protrusions 201B and 201D and the protrusions 201C and 201E at locations symmetrical with respect to the center in the direction of the width of the coupler body 201. This makes it possible to switch the direction of routing out the cable 203 with respect to the coupler body 201 as desired, and stably latch the cable 203 within the slit 201A.

Figure 4A:
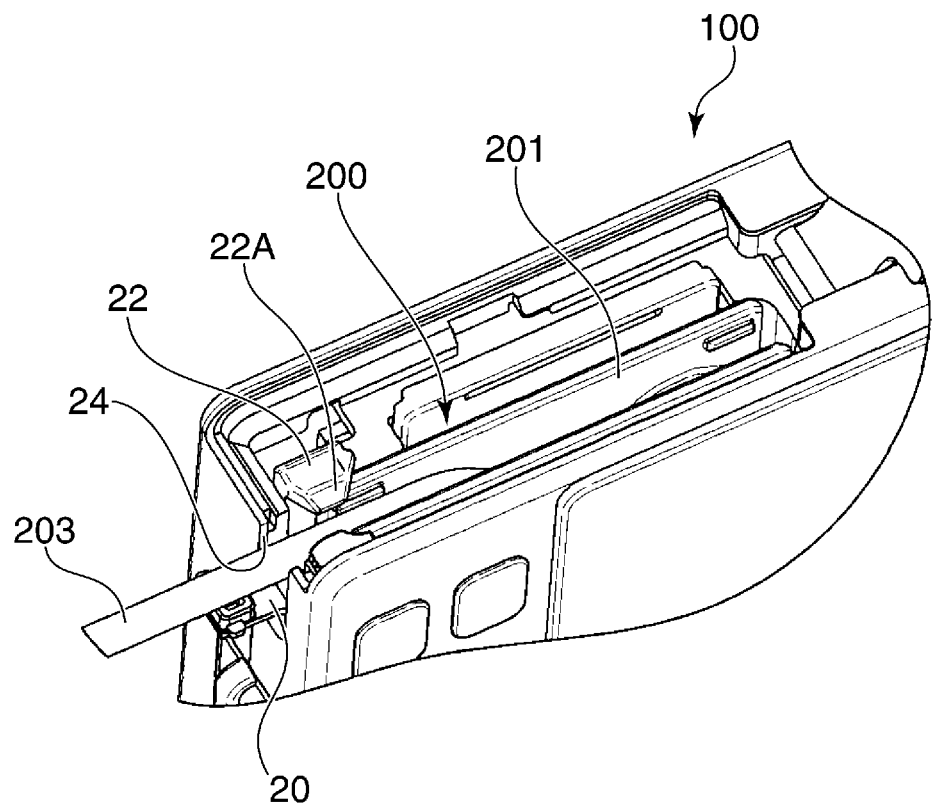
FIG. 4A is a perspective view showing a state where the coupler shown in FIG. 3A has been accommodated in a battery accommodating part appearing in FIG. 2A, and the battery lid is opened.
Figure 4B:
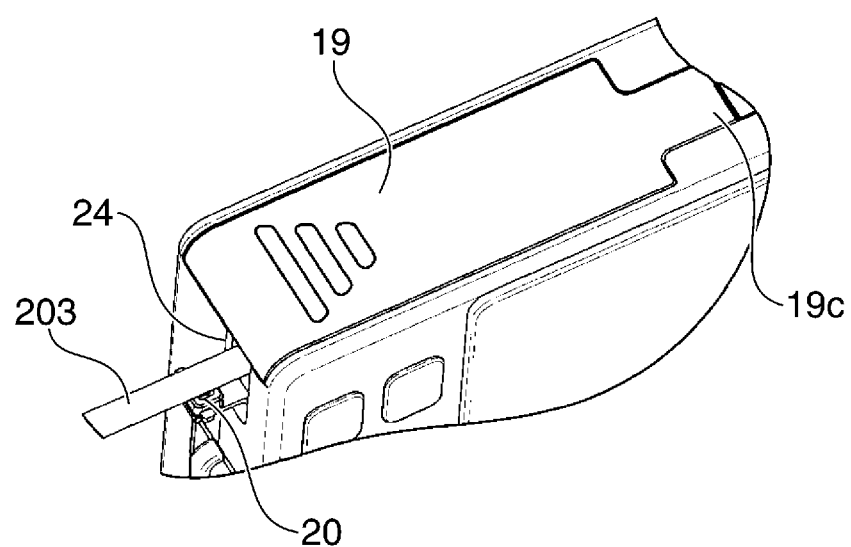
FIG. 4B is a perspective view showing a state where the coupler shown in FIG. 3A has been accommodated in the battery accommodating part appearing in FIG. 2A, and the battery lid is closed.

FIGS. 4A and 4B are views each showing a state where the coupler 200 has been accommodated in the battery accommodating part 21, in which FIG. 4A is a perspective view showing a state where the battery lid 19 is opened, and FIG. 4B is a perspective view showing a state where the battery lid 19 is closed.

Similarly to the above-described method of mounting the battery, the coupler body 201 is accommodated in the battery accommodating part 21 while cancelling the urging of the lock member 22 in the direction of blocking the opening of the battery accommodating part 21. When a certain amount of the coupler body 201 is thus inserted in the battery accommodating part 21, the cable 203 extending out of the coupler body 201 is brought into contact with the cable lid 20 latched to the camera body 100 by the come-off preventing portions 20A. At this time, the user is only required to push a portion of the cable lid 20 close to the come-off preventing portions 20A, toward outside of the camera body 100, to thereby open the cutout 24. This makes it possible to completely accommodate the coupler body 201 in the battery accommodating part 21 while disposing the cable 203 within the cutout 24 as shown in FIG. 4A.

In the state shown in FIG. 4A, the battery lid 19 is pivoted about the pivotal shaft 19C to thereby cover the battery accommodating part 21, and further, the battery lid 19 is slid toward the tripod mounting part 18 in the state where the battery lid 19 covers the battery accommodating part 21. This causes the engaging parts 19A formed on the battery lid 19 to be engaged with the engaged parts 23 formed around the battery accommodating part 21, whereby as shown in FIG. 4B, the accommodation of the coupler 200 in the camera body 100 is completed.

As mentioned hereinabove, the coupler body 201 has substantially the same outer dimensions as those of the battery accommodated in the battery accommodating part 21. Here, the protrusions 19B formed on the battery lid 19 are each set to be longer than the width of the slit 201A of the coupler body 201. With this setting, when the battery lid 19 is closed, the protrusions 19B are brought into contact with opposite walls (bottoms) forming the slit 201A of the coupler body 201, which makes it possible to restrict the movement of the coupler body 201. Therefore, even when an unintended external force is applied to the camera body 100 in the state shown in FIG. 4B, it is possible to prevent the electrical contacts between the coupler body 201 and the camera body 100 from becoming unstable. Therefore, it is possible to prevent occurrence of the problem of temporary interruption of the power supply to the camera body 100. Naturally, the shape of each protrusion 19B is configured such that in a case where the battery is accommodated in the battery accommodating part 21 as well, the movement of the battery is sufficiently restricted.

Figure 5:
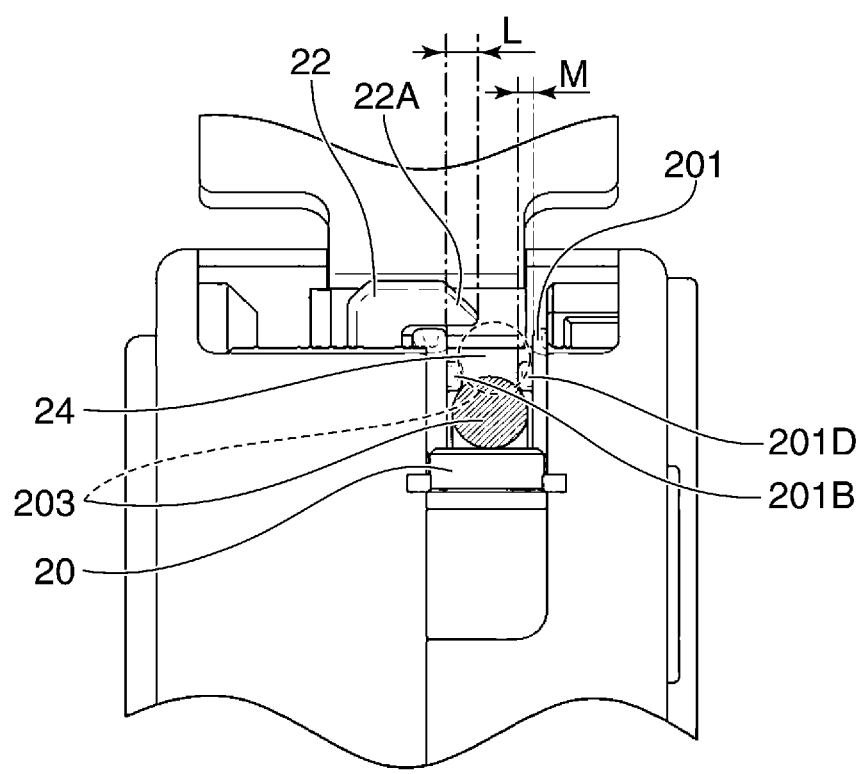
FIG. 5 is a side cross-sectional view showing a state where the coupler shown in FIG. 3A has been accommodated in the battery accommodating part appearing in FIG. 2A.

In the present embodiment, the camera body 100 has the structure in which the pawl portion 22A of the lock member 22 latches the cable 203 so as to smoothly close the battery lid 19, and the structure will be described in further detail with reference to FIGS. 4A and 5. FIG. 5 is a cross-sectional view showing a state where the coupler 200 has been accommodated in the battery accommodating part 21, as viewed from the lateral side of the camera body 100.

When the coupler 201 has been mounted in the battery accommodating part 21, the lock member 22 is pivoted toward the position of blocking the opening of the battery accommodating part 21 by action of the urging force of the aforementioned urging means, and the pawl portion 22A is engaged with the bottom surface of the coupler body 201 to thereby latch the coupler body 201. At this time, since the coupler 200 has the structure in which the direction of routing out the cable 203 is selectable between the two directions with respect to the coupler body 201 as shown in FIG. 3C, if a certain amount of force is applied to the cable 203, the cable 203 may be released from the state latched by the protrusions 201B and 201D to come out of the slit 201A. If the user tries to close the battery lid 19 in the state where the cable 203 has come out of the slit 201A, the cable 203 is caught between the lateral side of the camera body 100 and the battery lid 19, which degrades user friendliness.

To prevent occurrence of such a problem, in the present embodiment, the camera body 100 has the structure in which the pawl portion 22A of the lock member 22 covers part of the cable 203. That is, as shown in FIGS. 4A and 5, the pawl portion 22A is configured to overlap above the slit 201A by a length L (overlapping length L) shown in FIG. 5 from one of the inner walls of the slit 201A of the coupler body 201. Therefore, even when an external force is applied to the cable 203 in the direction of routing the cable out of the slit 201A, the pawl portion 22A prevents the cable 203 from coming out, and hence it is possible to prevent the problem that the cable 203 is caught between the lateral side of the camera body 100 and the battery lid 19 from occurring.

Here, the overlapping length L of the pawl portion 22A is set to be longer than a protruding length M of the protrusion 201B protruding from the inner wall, whereby it is possible to more positively prevent the cable 203 from being caught between the lateral side of the camera body 100 and the battery lid 19. The protruding length of the protrusions 201C to 201E is the same as that of the protrusion 201B.

Further, in the present embodiment, by providing the lock member 22 in the vicinity of the cutout 24, it is possible to hold a portion of the extending portion of the cable 203 closer to the front end (toward the connection part 204), and hence it is possible to effectively prevent the cable 203 from coming out. Further, the lock member 22 is arranged such that the pawl portion 22A overlaps above the cable 203 from a direction orthogonal to the direction of routing out the cable 203 while holding the coupler body 201. With this arrangement, when the cable 203 is set in the cutout 24, the lock member 22 does not interfere with an operation therefor, and hence it is possible to smoothly perform the operation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. For example, the present invention is applied not only to a digital camera, but also to various kinds of electronic apparatuses, each including an accommodating part which can accommodate a member including a cable, such as a cellular phone and a video camera.

This application claims the benefit of Japanese Patent Application No. 2011-280025, filed Dec. 21, 2011, which is hereby incorporated by reference herein in its entirety.

What is claimed is:

1. An electronic apparatus comprising:
a coupler including a coupler body and a cable, which extends out of the coupler body;
an accommodating unit configured to accommodate the coupler; and
an interlock member configured to interlock with the coupler accommodated in the accommodating unit,
wherein the coupler has a recessed portion which is capable of receiving the cable,
wherein a protrusion is provided on an inner wall of the recessed portion, and
wherein in a case where the cable is received within the recessed portion and the coupler is accommodated in the accommodating unit, the interlock member interlocks with the coupler body and prevents the cable from coming out from the recessed portion, and a tip portion of the interlock member is positioned above the recessed portion, and is positioned such that a length of the tip portion of the interlock member protruding from the inner wall is longer than a length of the protrusion protruding from the inner wall.

2. The electronic apparatus according to claim 1, wherein the accommodating unit has a cutout portion, and
wherein in a case where the cable is received within the recessed portion and the coupler is accommodated in the accommodating unit, the cable is routed out from the cutout portion.

3. The electronic apparatus according to claim 2, wherein the interlock member is arranged in the vicinity of the cutout portion.

* * * * *